June 12, 1956 R. P. CROW 2,750,451

AUDIO SYSTEM

Filed March 13, 1951 2 Sheets-Sheet 1

INVENTOR.
Robert P. Crow
BY
Foorman L. Mueller
Atty.

June 12, 1956 R. P. CROW 2,750,451

AUDIO SYSTEM

Filed March 13, 1951 2 Sheets-Sheet 2

INVENTOR.
Robert P. Crow
BY
Forman L. Mueller
Atty.

United States Patent Office 2,750,451

Patented June 12, 1956

2,750,451

AUDIO SYSTEM

Robert P. Crow, Chicago, Ill., assignor to Motorola, Inc., Chicago, Ill., a corporation of Illinois Application March 13, 1951, Serial No. 215,355

7 Claims. (Cl. 179—171)

Figures 1, 2:
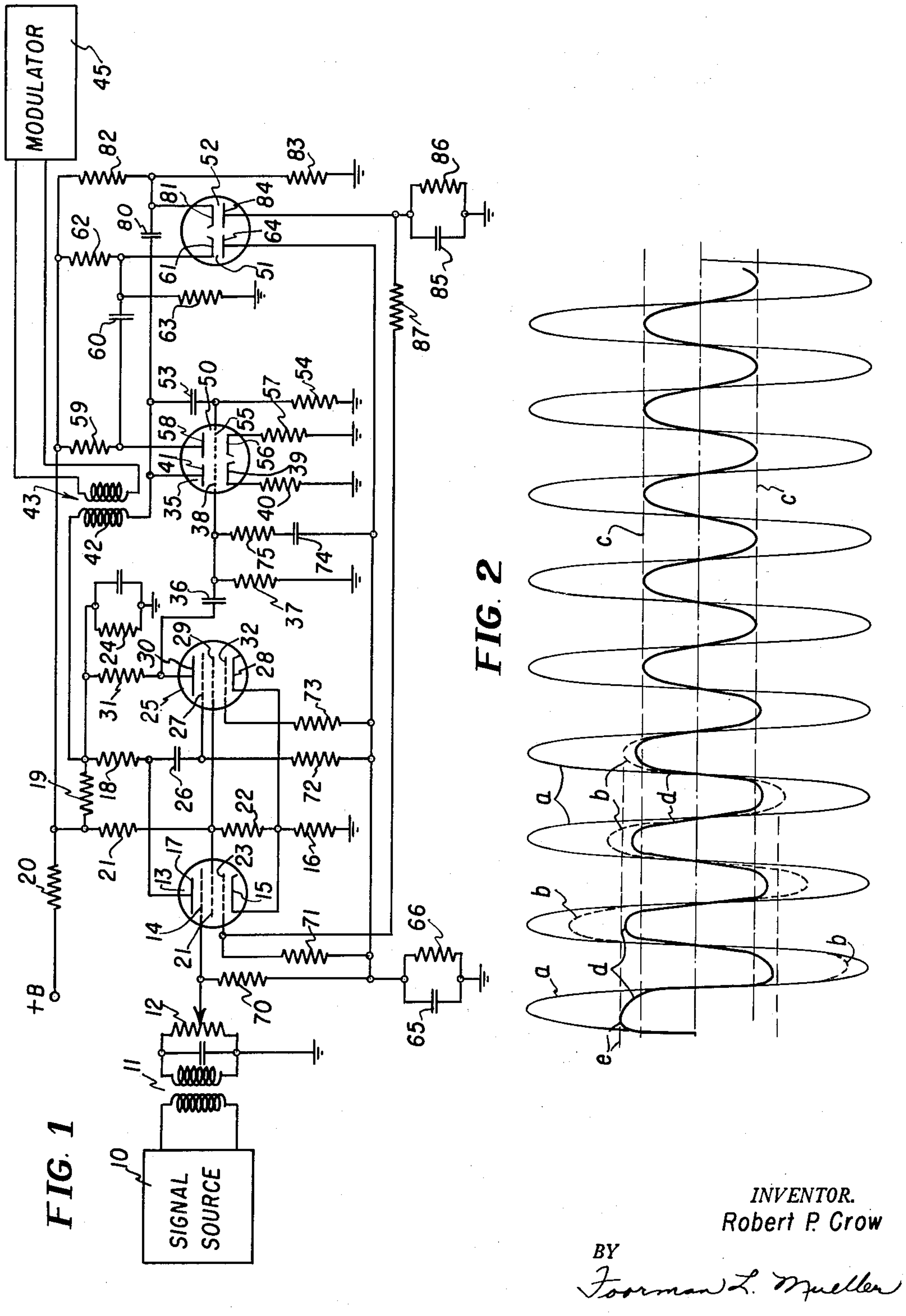

This invention relates generally to audio limiting systems, and more particularly to an audio amplifier having a control system for holding the output thereof within predetermined limits.

In many applications it is desired to limit the amplitude of an audio frequency wave so that the amplitude does not exceed a predetermined level. One such application is in systems for modulating a carrier wave by an audio signal or other low frequency signal in which it is desired that the modulation of the carrier wave be limited within a predetermined range. This is because such transmissions are limited to a particular frequency channel and modulation outside the channel causes interference with other communication in adjacent channels. Also the receiver used in such a system is effective to receive signals within the particular frequency channel and signals outside the channel are not effectively received thereby and therefore do not add to the intelligence received.

Various types of limiting and compressing circuits are known in which the output signal level is used to reduce the gain of an amplifier. However, such systems have the disadvantage that time delay is involved and sudden increases in intensity are not limited thereby. When used with a modulating wave this may cause over modulation of the carrier wave. Systems which are instantaneous in operation have been used but these systems have the disadvantage that they introduce losses of the signal and therefore require additional amplification and also may cause distortion of the limited signal wave.

It is therefore an object of the present invention to provide an improved limiting amplifier, the output level of which is held below predetermined limits both with respect to slow increases in the amplitude of the applied signal wave and also with respect to sudden increases in the amplitude thereof.

A further object of the invention is to provide a control circuit for an audio amplifier which limits the output level thereof instantaneously in response to sudden sharp increases in level and also provides a control voltage for reducing the gain of the amplifier.

A feature of the invention is the provision of an audio amplifier including a plurality of stages with a first circuit coupled to the amplifier output and to at least one of the stages and having a long time constant to provide a steady control of the amplifier output at a predetermined level, and a second circuit coupled to the amplifier output for limiting the amplitude thereof instantaneously at a level somewhat above the predetermined level and for instantaneously providing a control voltage which is applied to at least one of the stages of the amplifier for reducing the gain thereof.

A further feature of this invention is the provision of a limiting amplifier including a first control circuit coupled to the output of the amplifier and including a diode biased to conduct when the output of the amplifier reaches a predetermined value, with the diode being coupled through a long time constant circuit to the amplifier stages for providing a steady control of the gain thereof, and a second control circuit including a second diode connected to the amplifier output and biased to conduct when the output of the amplifier reaches a second value greater than the predetermined value to thereby instantaneously and positively limit the output to the second value. The second diode is connected to at least one stage of the amplifier through a network having a short time constant for controlling the gain thereof so that the output of the amplifier is immediately reduced when the output exceeds the second value. The second circuit is, of course, rendered ineffective when the first circuit operates to hold the output of the amplifier at the predetermined value.

Figure 3:
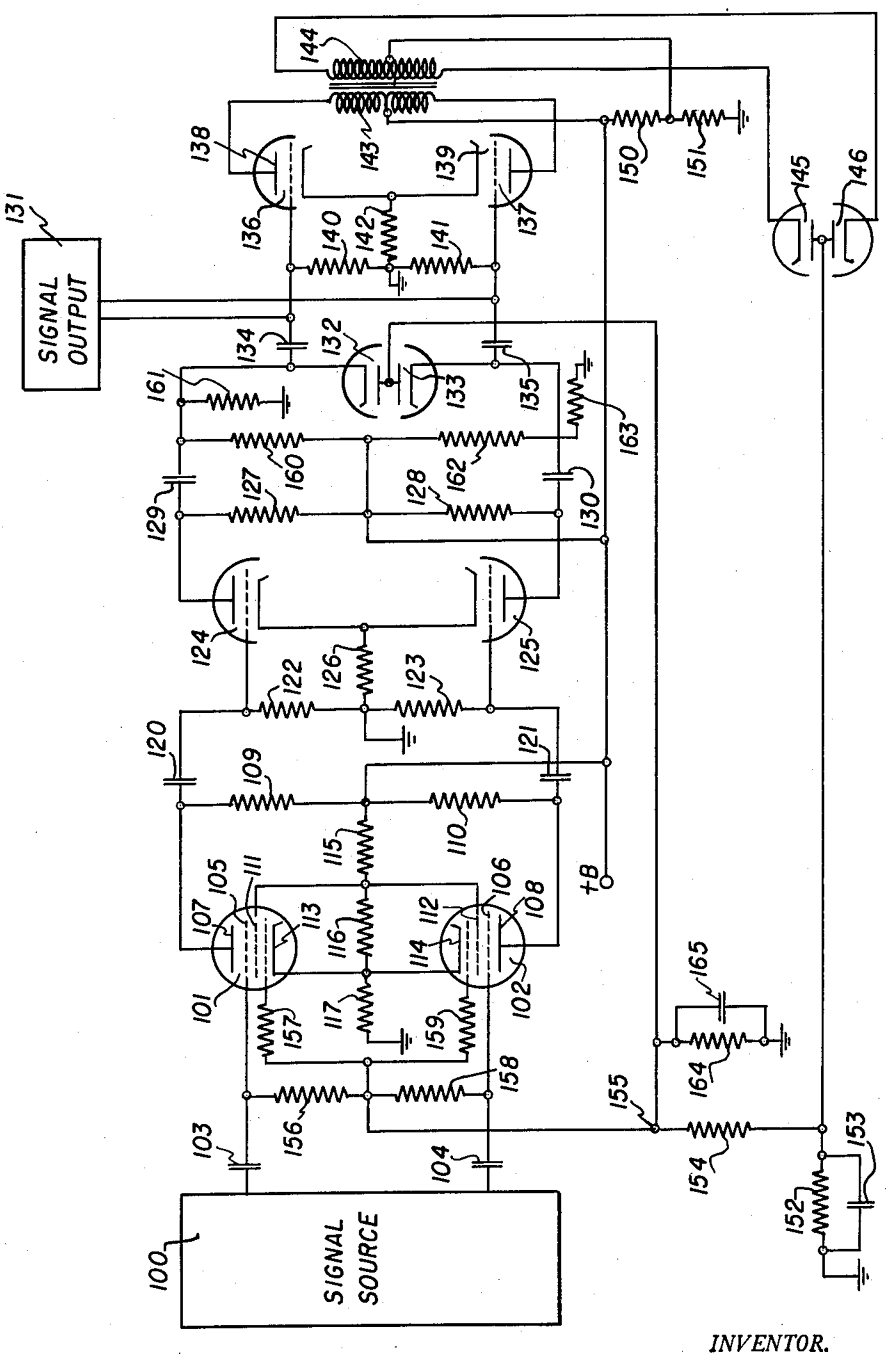

Further objects, features and the attending advantages of the invention will be apparent from a consideration of the following description taken in connection with the accompanying drawing in which:

Fig. 1 illustrates the limiting amplifier in accordance with the invention connected between an audio source and a modulator;

Fig. 2 includes curves illustrating the operation of the limiting amplifier; and Fig. 3 illustrates the application of the invention to a push-pull amplifier circuit.

In practicing the invention an audio amplifier is provided including a plurality of amplifying stages. An audio signal is applied to a grid of the tube of the first stage and is amplified as it passes through the various stages. The output of the amplifier is connected to a first control circuit including a diode to which a bias is applied so that the diode conducts when the output of the amplifier exceeds a predetermined value. The diode is connected by a network having a relatively long time constant to one or more grids of the tubes of one or more of the amplifier stages and provides a negative voltage for decreasing the gain thereof to hold the output at the predetermined value. A second control circuit including a second diode is connected to the output of the amplifier and is biased to conduct when the output of the amplifier exceeds a second value greater than said predetermined value. The second diode operates to clip the amplifier output at the second value and also to provide a control voltage for reducing the gain thereof. The second control circuit includes a very short time constant circuit for applying the voltage to one or more grids of the tubes of one or more of the amplifier stages for reducing the gain thereof instantaneously when the output of the amplifier reaches or exceeds the second value. The second control circuit has a recovery time substantially equal to the attack time of the first control circuit and is rendered inoperative when the first control circuit takes over to hold the output of the amplifier to the predetermined value. The limiting system in accordance with the invention is particularly applicable to push-pull amplifier circuits as in such systems the transients resulting from the gain control action may be balanced out.

In Fig. 1 the amplifier and control circuits therefor in accordance with the invention, are shown for applying signals from a source 10 to a modulator 45. The signal source 10 may be a source of audio signals such as a microphone, or any other source of modulating signals. Signals from the source are applied through a transformer 11 having a potentiometer 12 connected across the secondary coil thereof. A portion of the signal from the potentiometer is applied to a first vacuum tube 13, being coupled to the suppressor grid 14 thereof. The tube 13 includes a cathode 15 grounded through resistor 16, and a plate 17 connected to B plus potential through resistor 18 which is connected to a voltage divider network including resistors 20, 19 and 24. The tube 13 includes a screen grid 21 to which B plus potential is applied through a voltage divider network including resistors 20, 21, 22 and 16, and a control grid 23 which is connected to a control circuit as will be described more in detail. The output of the amplifier tube 13 is applied to the amplifier tube 25, being coupled through capacitor 26 to the suppressor grid 27 of the tube. The tube 25 includes a cathode 28 which is directly connected to the cathode 15 of the tube 13, and a screen grid 29 which is directly connected to a screen grid 21 of tube 13. The plate 30 of tube 25 is connected to B plus potential through resistor 31, connected to the voltage divider formed by resistors 20, 19 and 24, previously described. The tube also has a control grid 32 which is connected to the control circuit previously referred to. The output of the tube 25 is applied to still another amplifier tube 35 which is a triode. The signal from the plate 30 of the tube 25 is coupled through capacitor 36 and applied across resistor 37 to the control grid 38 of the triode. The cathode 39 of the triode is grounded through resistor 40 and the plate 41 thereof is coupled through winding 42 to B plus through the voltage divider previously described. The winding 42 may be the primary winding of a transformer 43 which is used to apply the amplified signal to the modulator 45.

For providing a steady state control of the output of the amplifier, a first control circuit is provided including the triode section 50 which is included in the same envelope as the triode section 35, and a diode section 51 included in the same envelope with a second diode section 52. The output of the last amplifier stage, triode 35, is supplied through capacitor 53 and across resistor 54 to the control grid 55 of the triode 50. The cathode 56 of the triode is grounded through resistor 57 and the plate 58 is connected to B plus through resistors 59 and 20 in series. The output of the triode 50 is applied through capacitor 60 to the cathode 61 of the diode 51. A bias voltage is also applied to the cathode 61, and is provided by the voltage divider formed by resistors 20, 62 and 63. The plate 64 of the diode is grounded through capacitor 65 and resistor 66 connected in parallel. The parallel circuit including capacitor 65 and resistor 66 has a relatively long time constant so that the voltage across the capacitor remains substantially steady. The bias applied to the cathode is adjusted so that current will flow through the diode to provide a voltage across the capacitor 65 when the output of the amplifier reaches a predetermined maximum level. The control circuit therefor provides a negative voltage when the output of the amplifier reaches said predetermined value, with the voltage increasing as the output of the amplifier increases. This voltage is applied to the grids of the amplifier tubes, being applied through resistor 70 to the suppressor grid 14 of the tube 13 and through resistor 71 to the control grid 23 of this tube. The control voltage is also applied through resistors 72 and 73 to the suppressor grid 27 and control grid 32, repectively, of the tube 25. A filter including capacitor 74 and resistor 75 may be provided to reduce the transient pulse resulting from the gain control circuit.

As previously stated, the control circuit including the diode 51 provides a steady state control voltage for holding the output of the amplifier at a predetermined level. In order to prevent signals at the output of the amplifier having high amplitude resulting from sudden sharp increases of the input signal and which are to rapid to be compensated for by the first control circuit, a second fast acting control circuit is provided including the diode 52. The signals from the amplifier output stage 35 are applied through capacitor 80 directly to the cathode 81 of this diode. A bias voltage is also applied to the cathode 81 of the diode 52 through the voltage divider network including resistors 20, 82 and 83, and the plate 84 of the diode is connected to ground through the parallel circuit including capacitor 85 and resistor 86.

The diode 52 and associated circuit serves a double purpose, first it acts as a clipper to cut off the amplitude of the output wave from the amplifier tube 35 when the amplitude thereof exceeds a predetermined value. Secondly, it provides a fast acting control voltage for reducing the gain of the amplifier tube 13 before the steady state gain control circuit is operative.

The amplitude at which the diode 52 acts as a clipper to limit the output of the amplifier depends upon the bias voltage applied to the cathode and therefore depends upon the value of resistors 20, 82, and 83. When the amplitude of the output of the tube 35 is sufficient to over-come this bias the diode 52 will conduct and clip the output wave. The current through the diode 52 will charge the condenser 85 to provide a voltage thereacross which is applied through resistor 87 to the tube 13 for reducing the amplification thereof. The value of the condenser 85 and the constants of the charging circuit therefor are selected so that the condenser charges very rapidly to provide instantaneous action. The value of the resistor 86 is so related to the value of the condenser 85 that the voltage will remain across the condenser 85 only long enough for the condenser 65 of the steady state gain control circuit to be charged. The steady state circuit will then take over and the circuit to eliminate high amplitude transients will be rendered ineffective.

The operation of the limiting system is clearly shown in Fig. 2. It is assumed that a high amplitude wave indicated as *a* is provided at the output of the amplifier, that is at the plate of the tube 35. The control circuit including the diode 51 will operate to decrease the amplitude of the output wave as shown by the dotted curve designated *b* and after a few cycles will bring the amplitude down to the desired level indicated by the dotted reference lines *c*. It is apparent from Fig. 2 that the amplitude of the output wave remains substantially above the desired level indicated by the reference lines *c* for several cycles before it is reduced to this level by the steady state control circuit. During this first period the control circuit including diode 52 operates to reduce the amplitude to that shown by the heavy curve designated *d*. The clipping action of the diode 52 instantaneously and positively prevents the signal from exceeding the level indicated by dotted line *e*. The fast acting gain control then reduces the level towards the level indicated by dotted line *c* until the steady gain control takes over to hold the signal at this level. As shown in Figure 2 the time constant of the control circuit including the diode 52 is short in comparison with the audio frequencies involved so that gain control action takes place during the first cycle of the wave. It is noted that this amplitude is held to a small percent over the desired reference level and that for the first few cycles the curve is distorted somewhat due to the clipping action.

In Fig. 3 there is illustrated an amplifier of the push-pull type embodying the limiting system in accordance with the invention. Signals from a source 100 are applied in push-pull to pentode tubes 101 and 102. The signal is applied through coupling condensers 103 and 104 respectively to the suppressor grids 105 and 106 of these tubes. Biasing potentials are applied to the tubes 100 and 102 from the plus B voltage source, with voltages being applied to the plates 107 and 108 through resistors 109 and 110 respectively, and being applied to the screen grids 111 and 112 and the cathodes 113 and 114 through a voltage divider network including resistors 115, 116 and 117. The push-pull output of the tubes 101 and 102 are applied through condensers 120 and 121 and across resistors 122 and 123 to the triode sections 124 and 125 which may be included in a single envelope. The signals are applied to the grids of the triodes with the cathodes thereof being connected through resistor 126 to ground and the plates being connected to plus B through resistors 127 and 128. The signals at the plates of the triode sections 124 and 125 are applied through condensers 129 and 134 in series and through condensers 130 and 135 in series to the output 131.

In the system of Fig. 3, the diodes 132 and 133 provide a fast acting gain control, and the amplifiers 136 and 137 and diodes 145 and 146 provide steady gain control. The output of the triode sections 124 and 125 is applied in push-pull through condensers 129 and 130 to the diode sections 132 and 133 which may be included in a single envelope, and through coupling condensers 134 and 135 to the grids 136 and 137 of triodes 138 and 139 which may also be included in the same envelope. Resistors 140 and 141 bias the grids 136 and 137 and a common resistor 142 provides bias to the cathodes. The plates of the triodes 138 and 139 are connected to the opposite ends of the transformer winding 143, with the secondary winding 144 being connected to the diode sections 145 and 146. The diodes 132 and 133 provide a balanced instantaneous limiting action in a manner similar to the diode 52 of Fig. 1, and the diodes 145 and 146 provide slow steady gain control action similar to the diode 51 of Fig. 1.

Considering first the action of the steady gain control circuit, resistors 150 and 151 form a voltage divider for providing a potential which is applied to the center tap on the secondary winding 144 to thereby provide a bias to the cathodes of the diodes 145 and 146. The plates of these diodes are connected to the time constant circuit including resistor 152 and condenser 153 across which the gain control voltage is developed. This voltage is applied to the amplifier tubes 101 and 102, being applied through resistor 154 to a terminal 155 which is connected by resistor 156 to the suppressor grid and through resistor 157 to the contol grid of tube 101. The point 155 is also connected through resistor 158 to the suppressor grid of tube 102 and through resistor 159 to the control grid of this tube. This circuit is arranged so that the condenser 153 charges after a predetermined time and is then effective to hold the gain of the amplifier system at a predetermined maximum level which may be the level represented by the dotted line *c* of Fig. 2.

As previously stated, the diode sections 132 and 133 provide a fast acting gain control voltage for instantaneously limiting the overall gain of the amplifier. A bias voltage is applied to the cathode of the diode 132 through the voltage divider formed by resistors 160 and 161, and to the cathode of the diode 133 through the voltage divider formed by resistors 162 and 163. The plates of the diodes are connected to the time constant circuit including the resistor 164 and the condenser 165. The voltage across the time constant circuit is applied to terminal 155 and to the control and suppressor grids of the tubes 101 and 102. The time constant of this circuit is very short so the control voltage is developed very rapidly to cut down the gain of the amplifier so that it is limited instantaneously to a value only slightly above the desired value such as the value indicated at *e* in Fig. 2. Actually, the result of the circuit of Fig. 3 conforms to the curve shown in Fig. 2 in the same manner specified with respect to Fig. 1.

It is apparent from the above that there is provided a control system for limiting the amplitude of the output of an amplifier to a predetermined reference level which is effective to positively limit the amplitude at a level somewhat above the reference level at all times. That is, the first few cycles of high amplitude signal which are not brought down to the reference level by the steady state control circuit is acted upon by the transient control circuit and held to a limit only slightly above the reference limit. Although the wave produced during this interim time may be somewhat distorted, the level is held down so that it does not produce overmodulation or other objectionable results and the distortion is substantial only during the beginning of the transient period. After the steady state gain control circuit takes over, the wave is compressed in a symmetrical way and is not distorted.

From the above it is apparent that there is provided a simple and effective audio limiter for positively limiting the amplitude of a low frequency signal. Only a single diode section is required for providing the control during the transient period before the steady state control circuit becomes effective, and the operation of the steady state control circuit is not effected in any way by this circuit which clips and reduces the transient high amplitude cycles.

Although one embodiment of the invention has been described which is illustrative thereof, it is obvious that various changes and modifications can be made therein without departing from the intended scope of the invention as defined by the appended claims.

I claim:

1. An audio amplifier system including in combination, an amplifying valve having at least one grid, means for applying an audio signal to a grid of said valve, a first diode coupled to the output of said amplifier system, means for providing a bias to said diode so that said diode conducts when the output of said amplifier system exceeds a predetermined value, a first network coupling said diode to at least one grid of said valve for providing a voltage thereto when said diode conducts, said network having a relatively long time constant so that the voltage applied therefrom to said valve produces a steady control of the gain thereof to hold the output of said amplifier below said predetermined level, a second diode coupled to the output of said amplifier system, means for biasing said second diode so that said second diode conducts when the output of said amplifier system exceeds said predetermined value by a fixed amount, means connecting said second diode to said amplifier system so that the output thereof is clipped at the value at which said second diode conducts, and a second network connecting said second diode to at least one grid of said valve for providing a voltage thereto when said second valve conducts, said second network having a relatively short time constant so that the voltage applied therefrom to said valve produces an instantaneous control of the gain thereof, said second network being inoperative when said first network holds the output of said amplifier system at said predetermined level.

2. An amplifier system including in combination, at least one amplifying valve having a plurality of grids, means for applying an audio signal to one of said grids, a first control circuit coupled to the output of said amplifier system including first diode means, means for providing a bias to said diode means so that said diode means conducts when the output of said amplifier system exceeds a first predetermined value, said first control circuit including a portion coupling said diode means to at least one grid of said valve for providing a negative voltage thereto when said diode means conducts, said first control circuit having a portion with a relatively long time constant across which said negative voltage is developed so that steady control of the gain of the amplifier system is provided, second diode means connected to the output of said amplifier system, means for biasing said second diode means so that said diode means conducts when the output of said amplifier system reaches a second predetermined value greater than said first predetermined value, said second diode means being so connected to said amplifier system to limit the output thereof at said second predetermined value.

3. An amplifier system including in combination, a plurality of amplifying stages each including an electron discharge valve having at least one grid, an input circuit, an output circuit, means for applying an audio signal to said input circuit, a first control circuit coupled to said output circuit of said amplifier system including a first diode, said first control circuit including amplifying means for applying the signal from said output circuit to said first diode, means for providing a bias to said diode so that said diode conducts when the signal applied thereto exceeds a first predetermined value, said first control circuit including a portion coupling said diode to a grid of at least one of said valves for reducing the gain thereof when said diode conducts, said first control circuit having a portion with a relatively long time constant across which said negative voltage is developed so that a steady control of the gain of the amplifier system is provided, a second diode having a plate and cathode with the cathode thereof connected to said output circuit of said amplifier system through a coupling condenser, a condenser and a resistor connected in parallel between said plate of said second diode and a reference point, means providing a bias voltage to said cathode of said second diode so that said diode conducts when the output of said amplifier system exceeds a second predetermined value greater than said first predetermined value to clip said output from said amplifier system and limit the same to said second predetermined value, and circuit means connecting said anode of said second diode to at least one grid of one of said valves for providing a negative voltage thereto when said second diode conducts, said parallel connected condenser and resistor providing a voltage at said anode instantaneously when said second diode conducts.

4. An audio amplifier system including in combination, at least one pair of amplifying valves connected in push-pull, each of said valves having at least one grid, means for applying an audio signal to a grid of each of said valves, a first pair of diodes coupled to the output of said amplifier system, means for providing a bias to said diodes so that at least one of said diodes conducts when the output of said amplifier system exceeds a predetermined value of either polarity, a first network coupling said diodes to a grid of each of said valves for providing a gain control voltage thereto when one of said diodes conducts, said network having a relatively long time constant so that the voltage applied therefrom to said valves produces a steady control of the gain thereof, a second pair of diodes coupled to the output of said amplifier system, means for biasing said second pair of diodes so that said diodes conduct when the output of said amplifier exceeds said predetermined value by a fixed amount, means connecting said diodes of second pair to said output of said amplifier system so that the signal at said output is clipped at the value at which said second diodes conduct, and a second network connecting said second pair of diodes to at least one grid of each of said valves for providing a gain control voltage thereto when said second pair of diodes conduct, said second network having a relatively short time constant so that the voltage applied therefrom to said valves produces an instantaneous control of the gain thereof.

5. An amplifier system including in combination, a plurality of amplifying valves arranged in pairs connected in push-pull, each of said valves having at least one grid, an input circuit for applying an audio frequency signal to said amplifier system, an output circuit, and a control network coupled to said output circuit including a first pair of diodes connected in push-pull and amplifying means for applying the signal from said output circuit to said diodes, means for providing a bias to said diodes so that said diodes conduct when a signal of either polarity is applied thereto which exceeds a first predetermined value, said first network coupling said diodes to grids of at least one pair of said valves for reducing the gain thereof when said diodes conduct, said network having a portion with a relatively long time constant across which said negative voltage is developed so that a steady control of the gain of the amplifier system is provided, a second pair of diodes having cathodes and anodes with the cathodes thereof connected in push-pull to said output circuit, means providing a bias voltage to said cathodes of said second pair of diodes so that said diodes conduct when the output of said amplifier system exceeds a second predetermined value greater than said first predetermined value, and circuit means connecting said anodes of said second pair of diodes to grids of at least one pair of said valves for providing a negative voltage thereto when said second pair of diodes conducts for reducing the gain of said amplifier system substantially instantaneously, said second pair of diodes operating to clip said output of said amplifier system so that said output cannot exceed said predetermined value.

6. An amplifier system including in combination a plurality of amplifying stages each including an electron discharge valve having at least one control electrode, an input circuit, an output circuit, means for applying an audio signal to said input circuit, a first control circuit coupled to said output circuit of said amplifier system including a first rectifying element, means for applying the signal from said output circuit to said rectifying element, means for providing a bias to said rectifying element so that conduction takes place therein only when the signal applied thereto exceeds a first predetermined value, said first control circuit having a portion with a relatively long time constant across which a negative voltage is developed when said rectifying element conducts for providing a steady control of the gain of the amplifier system, said first control circuit including a portion for applying said negative voltage to a control electrode of at least one of said valves for reducing the gain thereof, a second control circuit including a second rectifying element and means providing a bias voltage to said second rectifying element greater than the bias applied to said first rectifying element, said second control circuit including means connecting said output of said amplifier system to said second rectifying element so that said second rectifying element conducts to clip said output from said amplifier system and limit the same to a second predetermined value greater than said first predetermined value and determined by the bias applied to said second rectifying element, said second control circuit including a portion with a relatively short time constant across which a second negative voltage is instantaneously developed when said second rectifying element conducts, and means for applying said second negative voltage to a control electrode of at least one of said valves for rapidly reducing the gain thereof.

7. An amplifier system including in combination, a plurality of amplifying stages each including an electron discharge device having at least one control electrode, an input circuit coupled to a control electrode of the electron device of the first stage, means for applying an audio signal to said input circuit, an output circuit for said amplifying stages, a first control circuit coupled to said output circuit including a first rectifying element, means for applying the signal from said output circuit to said rectifying element, means for providing a bias to said rectifying element so that conduction takes place therein only when the signal applied thereto exceeds a first predetermined value, said first control circuit having a portion with a relatively long time constant across which a control voltage is developed when said rectifying element conducts for providing a steady control of the gain of the amplifier system, said first control circuit including a portion for applying said control voltage to a control electrode of at least one of said electron devices for reducing the gain thereof, a second control circuit including a second rectifying element and means providing a bias voltage to said second rectifying element greater than the bias applied to said first rectifying element, said second control circuit including means connecting said second rectifying element to said output circuit of said amplifier system so that said second rectifying element conducts to clip signals in said output circuit and limit the same to a second predetermined value greater than said first predetermined value and determined by the bias applied to said second rectifying element, said second control circuit including a portion with a relatively short time constant across which a second control voltage is instantaneously developed when said second rectifying element conducts, and means for applying said second control voltage to a control electrode of at least one of said electron devices for rapidly reducing the gain thereof.

References Cited in the file of this patent

UNITED STATES PATENTS

| | | |
|---|---|---|
| 1,979,035 | Hammond, Jr. | Oct. 30, 1934 |
| 2,245,353 | Morlock | June 10, 1941 |
| 2,259,520 | Freeman | Oct. 21, 1941 |
| 2,295,410 | Kreuzer | Sept. 8, 1942 |
| 2,390,502 | Atkins | Dec. 11, 1945 |
| 2,390,856 | Thompson | Dec. 11, 1945 |
| 2,405,845 | Pfaff | Aug. 13, 1946 |
| 2,533,253 | Howard | Dec. 12, 1950 |
| 2,673,899 | Montgomery | Mar. 30, 1954 |

FOREIGN PATENTS

| | | |
|---|---|---|
| 640,920 | Great Britain | Aug. 2, 1950 |